(12) United States Patent
Diamant et al.

(10) Patent No.: US 11,868,875 B1
(45) Date of Patent: Jan. 9, 2024

(54) DATA SELECTION CIRCUIT

(71) Applicant: Amazon Technologies, Inc., Seattle, WA (US)

(72) Inventors: Ron Diamant, Albany, CA (US); Randy Renfu Huang, Morgan Hill, CA (US); Jeffrey T. Huynh, San Jose, CA (US); Sundeep Amirineni, Austin, TX (US)

(73) Assignee: Amazon Technologies, Inc., Seattle, WA (US)

(*) Notice: Subject to any disclaimer, the term of this patent is extended or adjusted under 35 U.S.C. 154(b) by 1246 days.

(21) Appl. No.: 16/127,170

(22) Filed: Sep. 10, 2018

(51) Int. Cl.
*G06N 3/065* (2023.01)
*G11C 11/54* (2006.01)
*G06N 3/049* (2023.01)

(52) U.S. Cl.
CPC .............. *G06N 3/065* (2023.01); *G06N 3/049* (2013.01); *G11C 11/54* (2013.01)

(58) Field of Classification Search
CPC .................................................... G06N 3/0635
USPC .......................................................... 706/38
See application file for complete search history.

(56) References Cited

U.S. PATENT DOCUMENTS

| | | | |
|---|---|---|---|
| 9,195,934 B1* | 11/2015 | Hunt | G06V 20/10 |
| 9,582,726 B2* | 2/2017 | Pan | G06T 5/20 |
| 9,805,303 B2* | 10/2017 | Ross | G06N 3/08 |
| 9,971,540 B2* | 5/2018 | Herrero Abellanas | G06F 3/0683 |
| 10,817,260 B1* | 10/2020 | Huang | G06F 7/523 |
| 2011/0029471 A1* | 2/2011 | Chakradhar | G06N 3/0454 706/25 |
| 2016/0086077 A1* | 3/2016 | Akopyan | G06N 3/063 706/23 |
| 2016/0155048 A1* | 6/2016 | McCormick | G06N 3/04 706/27 |
| 2016/0358069 A1* | 12/2016 | Brothers | G06F 7/764 |
| 2017/0024632 A1* | 1/2017 | Johnson | G06N 3/045 |

(Continued)

OTHER PUBLICATIONS

Q. Yin et al., "FPGA-based High-performance CNN Accelerator Architecture with High DSP Utilization and Efficient Scheduling Mode," 2020 International Conference on High Performance Big Data and Intelligent Systems (HPBD&IS), 2020, pp. 1-7, doi: 10.1109/HPBDIS49115.2020.9130576. (Year: 2020).*

(Continued)

*Primary Examiner* — James D. Rutten
(74) *Attorney, Agent, or Firm* — Kilpatrick Townsend & Stockton LLP

(57) ABSTRACT

Provided are systems and methods for operating a neural network processor, wherein the processor includes an input selector circuit that can be configured to select the data that will be input into the processor's computational array. In various implementations, the selector circuit can determine, for a row of the array, whether the row input will be the output from a buffer memory or data that the input selector circuit has selected for a different row. The row can receive an input feature map from a set of input data or an input feature map that was selected for inputting into a different row, such that the input feature map is input into more than one row at a time. The selector circuit can also include a delay circuit, so that the duplicated input feature map can be input into the computational array later than the original input feature map.

17 Claims, 8 Drawing Sheets

(56) References Cited

U.S. PATENT DOCUMENTS

| | | | |
|---|---|---|---|
| 2017/0236053 A1* | 8/2017 | Lavigueur | G06N 3/063 706/31 |
| 2017/0344876 A1* | 11/2017 | Brothers | G06N 3/04 |
| 2018/0173571 A1* | 6/2018 | Huang | G06N 3/0481 |
| 2018/0285715 A1* | 10/2018 | Son | G06N 3/04 |
| 2018/0300631 A1* | 10/2018 | Roy | G06N 3/088 |
| 2018/0314671 A1* | 11/2018 | Zhang | G06N 3/063 |
| 2019/0138892 A1* | 5/2019 | Kim | G06N 3/049 |

OTHER PUBLICATIONS

J. Wang, J. Lin and Z. Wang, "Efficient Hardware Architectures for Deep Convolutional Neural Network," in IEEE Transactions on Circuits and Systems I: Regular Papers, vol. 65, No. 6, pp. 1941-1953, Jun. 2018, doi: 10.1109/TCSI.2017.2767204. (Year: 2018).*

\* cited by examiner

DATA SELECTION CIRCUIT

BACKGROUND

Neural network processors are purpose-built integrated circuit devices for executing neural networks. Execution of a neural network can include many simple computations that can be performed in parallel. A neural network processor thus can include an array of small processing engines that can perform a simple computation, such as a multiply and add computation. The operation of a neural network processor can further be optimized around moving data into and out of the array of processing engines, so that the neural network can be executed quickly. General purpose processors, in contrast, may be optimized to perform a diverse range of operations, so that these processor can handle a wide variety of tasks.

BRIEF DESCRIPTION OF THE DRAWINGS

Various embodiments in accordance with the present disclosure will be described with reference to the drawings, in which.

DETAILED DESCRIPTION

Figure 1:
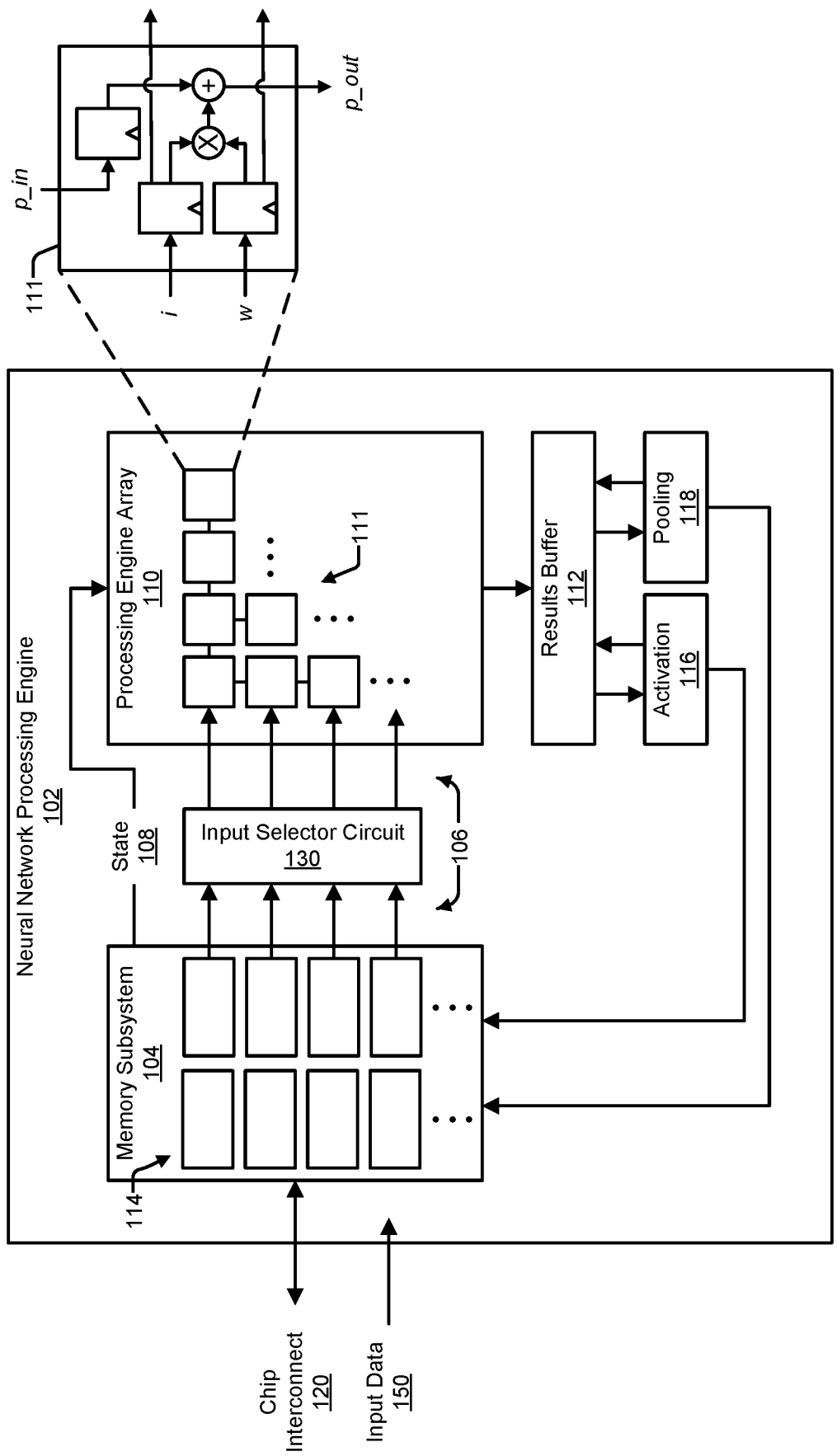
FIG. 1 includes a block diagram that illustrates an example of a neural network processing engine of a neural network processor.

Neural networks take inspiration from the mechanics of the operation of the human brain. In a neural network, neurons are represented by nodes and synapses are represented by weighted connections between the nodes. The weights can reflect different responses to input. A neural network can be arranged in layers, where input data to be analyzed is provided to an input layer, and the outputs of each layer provide the inputs to the next layer. The last layer can output a result. The weight values can be determined through training, during which input data with a known result is provided to the neural network.

The computations of a neural networks can be performed using a Central Processing Unit (CPU). CPUs, however, tend to be optimized for sequential rather than parallel computations, and thus can suffer from poor response times. Graphics Processing Units (GPUs) are optimized for parallel computations, but not necessarily for the result from one computation unit to be provided directly to another computation unit. Often, the result must first be written to a memory. GPUs, though having better response times than CPUs, may nevertheless lag in response times.

Special-purpose neural network processors include computational arrays optimized for parallel, chained computations, and can perform better than both CPUs and GPUs on the same input data, in certain situations.

In various examples, the architecture of a neural network includes an input layer, an output layer, and a number of intermediate layers, often referred to as hidden layers. Each layer executes a computation on the outputs of the previous layer, with the last layer (the output layer) providing a final result. With more layers, a neural network can, theoretically, perform more complex tasks, such as language translations and distinguishing the contents of one image from another. A neural network with more than three hidden layers is sometimes referred to as a deep neural network. Deep neural networks can have many hidden layers, such as, for example, between five and more than a thousand layers.

In various examples, utilization of the computational array of a neural network processor approximates the overall performance of the processor. For example, when the computational array is at 75% utilization, then the neural network processor may be be operating at approximately 75% of the processor's possible maximum capability. Maintaining high utilization of the computational array can thus maximize the speed at which the computations for a neural network are performed, how quickly the task for which the neural network is trained can be completed, and the how quickly answers can be produced from the neural network.

In some examples, a neural network may be operated such that a filter can be applied to input feature maps using different rows of the neural network processor's computational array. For example, when the inputs to a layer of a neural network includes more than one input feature map, each input feature map can be input into a different row, and the processing engines in the row can apply a particular filter to each of the input feature maps. Additionally, output feature maps can computed on the columns of the computational array. This arrangement may be particularly efficient when the horizontal operation of the computational array is a multiplication and the vertical operation is an accumulation. This arrangement can also be memory efficient, because the values for an input feature map can be written to sequential locations in a memory that is used to feed data into the computational array.

In some convolutional neural networks, however, the first layer includes only three input feature maps, one each for the red channel, the green channel, and the blue channel (which may be present, for example, in a color image) of the input data set. Convolutional neural networks are used for tasks such as image recognition, speech recognition, and machine translation, among other tasks, and are sometimes favored over other neural network architectures due to being able to produce more accurate outputs. For these neural networks, the first layer of the network may only occupy the first three rows of the computational array, one for each input feature map, leaving the remaining rows idle until the next layer. As an example, for a computational array that has 128 rows and 64 columns, using just three rows of the computational array to compute an output for the first layer of a neural network can result in 2.3% utilization for the first layer's computations.

Though the first layer of a neural network may occur only once during the execution of the neural network, over the course of multiple executions of the neural network the low utilization by the first layer can have an impact. As an example of the impact, Table 1 below illustrates the utilization of a 128 row, 64 column computational array when the array executes various example neural networks. Illustrated in this example is the utilization of 8-bit unsigned integer computational units in the computational array and 16-bit floating point computational units over many inputs for each neural network.

TABLE 1

| Neural Network | UINT8 utilization | FP16 utilization |
|---|---|---|
| Resnet-34 | 44% | 45% |
| Resnet-50 | 40% | 40% |
| Resnet-152 | 66% | 66% |
| Inception_v3 | 23% | 24% |

One solution for increasing the utilization of the computational array when computing the first layer is to use the idle rows to apply different filter elements to the input feature maps. A filter applied to an input feature map can include an array of filter elements. As an example, instead of sequentially applying each filter element in the filter to an input feature map, multiple feature elements can be applied in parallel. In this example, it may thus be possible to occupy six rows of the computational array to apply two filter elements, nine rows to apply three filter elements, and so on. As an example, for a computational array that has 128 rows and 64 columns, replicating three input feature maps 24 times can result in a utilization of 57% for the first layer. Table 2 below illustrates examples of the utilization that is theoretically possible when the input feature maps of the first layer are duplicated across multiple rows and different filter elements are applied to the duplicates:

TABLE 2

| Neural Network | UINT8 utilization | FP16 utilization |
|---|---|---|
| Resnet-34 | 89% | 92% |
| Resnet-50 | 84% | 86% |
| Resnet-152 | 91% | 92% |
| Inception_v3 | 71% | 76% |

To enable multiple filter elements to be applied to the multiple copies of the input feature maps of the first layer, the neural network processing engine can have multiple copies of the input feature maps arranged for inputting into the rows of the computational array. The neural network processor can include a memory, which can also be referred to as a buffer, that holds data for inputting into the computational array. In some examples, software that is operating the neural network processor can load multiple copies of the input feature maps into the memory, with the copies arranged in the memory for inputting into different rows of the computational array. In these examples, the neural network processor would not need any additional circuitry for multiple copies of the input feature maps to be input into the computational array, and only needs to be appropriately programmed in order to improve overall utilization of the computational array.

In various examples, however, other practicalities may interfere with the optimization that can be accomplished through software programming. For example, memory bandwidth in the neural network processor may have a limit, where the limit is dictated by factors such as the amount of space available on the chip for an interconnect between the neural network processor's processing engines and external memory where the data for a neural network is stored; the speed at which data can be transferred over the interconnect; and/or availability of the interconnect, which may be occupied with moving data between other components of the neural network processor.

Memory bandwidth delay can reduce the utilization that is gained by replicating the input feature maps. For example, in an example neural network processor, the available memory bandwidth can be 32 gigabytes (GB) per second (GB/s), and an input color image can be about 300 kilobytes (KB) in size. In this example, copying the input image 24 times can take about 0.23 milliseconds (ms). Executing the neural networks listed in Table 1 and Table 2 above may take about 26 microseconds (μs), meaning that the utilization gain from copying the input image is reduced. Table 3 below illustrates practical examples of computational array utilization, where the time needed to copy the input image 24 times is included:

TABLE 3

| Neural Network | UINT8 utilization | FP16 utilization |
|---|---|---|
| Resnet-34 | 64% | 66% |
| Resnet-50 | 60% | 61% |
| Resnet-152 | 80% | 81% |
| Inception_v3 | 41% | 43% |

In various implementations, provided are systems and methods for operating an integrated circuit for a neural network processor, where the integrated circuit includes an input selector circuit that can be configured to select the data that will be input into neural network processor's computational array. In various examples, the input selector circuit, which is also referred to herein as a selector circuit, can determine, for a row of the computational array, whether the row input will be the output from a buffer memory or data that the input selector circuit has selected for a different row. In the former case, the row can receive, for example, an input feature map from a set of input data. In the latter case, the row can receive an input feature map that was selected for inputting into a different row, such that the input feature map is input into more than one row at a time. In various examples, the selector circuit can also include a delay circuit, so that the duplicated input feature map can be input into the computational array later than the original input feature map. In these and other examples, different filter elements can be applied to the original input feature map and to the duplicated input feature map, so that utilization of the computational array is increased and the computation of the output feature maps can be performed in fewer clock cycles.

In various examples, an input selector circuit in a neural network processor can improve the performance of the neural network processor when computing a result for the first layer of a neural network. For example, in input feature map that is an input for the first layer of the neural network can be input into the computational array three or more times, with a different filter element being applied to each copy. In some examples, the second and subsequent layers of the neural network may have many input feature maps as inputs. In these examples, the input selector circuit can be configured so that duplication of the inputs to the computational array is disabled, and the computational array receives as inputs the outputs from the buffer memory.

Various examples will be described herein. For purposes of explanation, specific configurations and details are set forth in order to provide a thorough understanding of the examples. However, it will also be apparent to one skilled in the art that the examples may be practiced without the specific details. Furthermore, well-known features may be omitted or simplified in order not to obscure the examples being described.

FIG. 1 includes a block diagram that illustrates an example of a neural network processing engine 102 of a neural network processor. In various implementations, the neural network processing engine 102, for a set of input data, can execute a neural network to perform a task the neural network was trained for. Executing a neural network on a set of input data can be referred to as inference or performing inference. In various implementations, the example neural network processing engine 102 is an integrated circuit component of a neural network processor. The neural network processor can have other integrated circuit components, including additional neural network processing engines.

In various implementations, the neural network processing engine 102 can include a memory subsystem 104 and a processing engine array 110. In various examples, the neural network processing engine 102 can include a input selector circuit 130 placed between the memory subsystem 104 and the processing engine array 110. The input selector circuit 130 can determine the data that is input into the processing engine array 110, as discussed further below. When in operation (e.g., when computing a result for a set of input data 150), the processing engine array 110 can read weight 106 and state 108 values from the memory subsystem 104. The processing engine array 110 can output computation results to a results buffer 112. In some cases, the example neural network processing engine 102 can perform an activation function (using an activation 116 block) and/or pooling (using a pooling 118 block) on the results from the processing engine array 110, before the results are written to the memory subsystem 104.

Weights 106, in this example, are the weight values for a neural network. In various examples, the weights 106 are post-training weights, meaning that values for the weights 106 were previously determined. State 108, in this example, can include input data 150 when a computation begins, as well as intermediate values that reflect an in-progress computation. State 108, for example, can include partial sums determined by the processing engine array 110. State 108 can also include instructions for the processing engine array 110, where the instructions may be associated with a particular layer. The instructions can, for example, instruct the processing engine array 110, and possibly also the activation 116 and/or pooling 118 blocks, to execute a certain computation. The weights 106 and the state 108 can be read from the memory subsystem 104 for operating on by the processing engine array 110. In some examples, the memory subsystem can also include a separate memory or buffer for instructions.

In various implementations, the memory subsystem 104 can include multiple memory banks 114. In these implementations, each memory bank 114 can be independently accessible, meaning that the read of one memory bank is not dependent on the read of another memory bank. Similarly, writing to one memory bank does not affect or limit writing to a different memory bank. In some cases, each memory bank can be read and written at the same time. Various techniques can be used to have independently accessible memory banks 114. For example, each memory bank can have at least one read channel and may have at least one separate write channel that can be used at the same time. In these examples, the memory subsystem 104 can permit simultaneous access to the read or write channels of multiple memory banks. As another example, the memory subsystem 104 can include arbitration logic such that arbitration between, for example, the outputs of multiple memory banks 114 can result in more than one memory bank's output being used. In these and other examples, though globally managed by the memory subsystem 104, each memory bank can be operated independently of any other.

Having the memory banks 114 be independently accessible can increase the efficiency of the neural network processing engine 102. For example, weights 106 and state 108 can be simultaneously read and provided to each row of the processing engine array 110, so that the entire processing engine array 110 can be in use in one clock cycle. As another example, weights 106 and state 108 can be read at the same time that intermediate results are written to the memory subsystem 104. In contrast, a single memory, while still able to provide weights 106 and state 108 to the processing engine array 110 faster than off-chip memory, may be able to service only one read or write at a time. With a single memory, multiple clock cycles can be required, for example, to read weights for each row of the processing engine array 110 before the processing engine array 110 can be started.

In various implementations, the memory subsystem 104 can be configured to simultaneously service multiple clients, including the processing engine array 110, the activation 116 block, the pooling 118 block, and any external clients that access the memory subsystem 104 over a chip interconnect 120. In some implementations, being able to service multiple clients can mean that the memory subsystem 104 has at least as many memory banks as there are clients. In some cases, each row of the processing engine array 110 can count as a separate client. In these cases, weights 106 and state 108 can be stored separately, and thus require pairs of reads, or can be concatenated and stored together, thus requiring one read. In some cases, each column of the processing engine array 110 can output an intermediate value, such that each column can count as a separate write client. In some cases, output from the processing engine array 110 can be written into the memory banks 114 that can then subsequently provide input data for the processing engine array 110. The memory banks 114 can be implemented, for example, using static random access memory (SRAM).

In various implementations, the memory subsystem 104 can include control logic. The control logic can, for example, keep track of the address spaces of each of the memory banks 114, identify memory banks 114 to read from or write to, and/or move data between memory banks 114, if needed. In some implementations, the memory subsystem 104 can include multiplexors for selecting which memory bank to output to a particular client and/or to receive input from a particular client. In these implementations, the control logic can generate select signals for the multiplexors, which can enable some or all of the memory banks 114 to service each client. In some implementations, memory banks 114 can be hardwired to particular clients. For example, a set of memory banks 114 can be hardwired to provide weights 106 and state 108 to the rows of the processing engine array 110. In these examples, the control logic can move data between memory banks 114, for example, to move intermediate results from the memory banks 114 to which the intermediate results are written, to the memory banks 114 from which the intermediate results will be read for the next round of computation.

The processing engine array 110 is the computation matrix of the neural network processing engine 102. The processing engine array 110 can, for example, execute parallel integration, convolution, correlation, and/or matrix multiplication, among other things. The processing engine array 110 includes multiple processing engines 111, arranged in rows and columns, such that results output by one processing engine 111 can be input directly into another processing engine 111. Processing engines 111 that are not on the outside edges of the processing engine array 110 thus can receive data to operate on from other processing engines 111, rather than from the memory subsystem 104.

In various examples, the processing engine array 110 uses systolic execution, in which data arrives at each processing engine 111 from different directions at regular intervals. In some examples, input data can flow into the processing engine array 110 from the left and weight values can be loaded at the top. In some examples weights and input data can flow from the left and partial sums can flow from top to bottom. In these and other examples, a multiply-and-accumulate operation moves through the processing engine array 110 as a diagonal wave front, with data moving to the right and down across the array. Control signals can be input at the left at the same time as weights 106, and can flow across and down along with the computation.

In various implementations, the number of columns in the processing engine array 110 determines the computational capacity of the processing engine array 110, and the number of rows determines the required memory bandwidth for achieving maximum utilization of the processing engine array 110. The processing engine array 110 can have, for example, 64 columns and 128 rows, or some other number of columns and rows.

An example of a processing engine 111 is illustrated in FIG. 1 in an inset diagram. As illustrated by this example, a processing engine 111 can include a multiplier-accumulator circuit. Inputs from the left can include, for example, input data i and a weight value w, where the input data is a value taken from either a set of input data or a set of intermediate results, and the weight value is from a set of weight values that connect one layer of the neural network to the next. A set of input data can be, for example, an image being submitted for identification or object recognition, an audio clip being provided for speech recognition, a string of text for natural language processing or machine translation, or the current state of a game requiring analysis to determine a next move, among other things. In some examples, the input data and the weight value are output to the right, for input to the next processing engine 111.

In the illustrated example, an input from above can include a partial sum, p_in, provided either from another processing engine 111 or from a previous round of computation by the processing engine array 110. When starting a computation for a new set of input data, the top row of the processing engine array 110 can receive a fixed value for p_in, such as zero. As illustrated by this example, i and w are multiplied together and the result is summed with p_in to produce a new partial sum, pout, which can be input into another processing engine 111. Various other implementations of the processing engine 111 are possible.

Outputs from the last row in the processing engine array 110 can be temporarily stored in the results buffer 112. The results can be intermediate results, which can be written to the memory banks 114 to be provided to the processing engine array 110 for additional computation. Alternatively, the results can be final results, which, once written to the memory banks 114 can be read from the memory subsystem 104 over the chip interconnect 120, to be output by the system.

In some implementations, the neural network processing engine 102 includes an activation 116 block. In these implementations, the activation 116 block can combine the results from the processing engine array 110 into one or more output activations. For example, for a convolutional neural network, convolutions from multiple channels can be summed to produce an output activation for a single channel. In other examples, accumulating results from one or more columns in the processing engine array 110 may be needed to produce an output activation for a single node in the neural network. In some examples, activation 116 block can be bypassed.

In some implementations, the neural network processing engine 102 can include a pooling 118 block. Pooling is the combining of outputs of a cluster of nodes from a layer of a neural network. The combined output can be provided to the next layer. Combining can include for example, computing a maximum value, a minimum value, an average value, a median value, or some other value determined from the outputs of the cluster of nodes. In various examples, the pooling 118 can be selectively activated, as needed for any particular neural network.

Input data 150 can arrive over the chip interconnect 120. The chip interconnect 120 can connect the neural network processing engine 102 to other components of a neural network processor, such as a Direct Memory Access (DMA) engine that can obtain input data 150 from an Input/Output (I/O) device, a storage drive, or a network interface. The input data 150 can be, for example one-dimensional data, such as a character string or numerical sequence, or two-dimensional data, such as an array of pixel values for an image or frequency and amplitude values over time for an audio signal. In some examples, the input data 150 can be three-dimensional, as may be the case with, for example, the situational information used by a self-driving car. In some implementations, the memory subsystem 104 can include a separate buffer for the input data 150. In some implementations, the input data 150 can be stored in the memory banks 114 along with the weights 106.

In various implementations, the weights 106 stored in the memory subsystem 104 can have been determined by training the neural network to perform one or more tasks. The input data 150 can include an instruction indicating the task to perform (e.g., image processing, speech recognition, machine translation, etc.). In various implementations, the neural network processing engine 102 is configured for conducting inference (e.g., performing a task), rather than for training of the neural network. In some implementations, the neural network processing engine 102 can be used for training, possibly with assistance from software to update the stored weights 106.

In various implementations, the memory subsystem 104 can include enough memory to store both intermediate results and all of the weight values for a neural network. The memory subsystem 104 should have, at a minimum, enough memory in the memory subsystem 104 to store intermediate results, but in many cases the memory subsystem 104 can include many more memory banks 114 than are needed to store just intermediate results. This additional space can be used to store some or all of the weight values for a neural network before the neural network processing engine 102 is instructed to perform inference. For example, a neural network may have 1.5 million weights, which, when each is represented by 32 bits, can require about 6 MB of memory. Intermediate results can require, for example, 10 MB of storage space, at most. On-chip memory of 20 MB is a reasonable size, and, in the preceding example, can readily accommodate the weight values, intermediate results, and any other data that the neural network processing engine 102 can need during operation.

In some examples, some or all of the weights for a neural network can be loaded into the memory subsystem 104 before the neural network processing engine 102 begins operating on a set of input data 150. In some cases, weights can continue to be loaded during the computation of a result for the set of input data 150. In these examples, the weights and other data for a neural network (such as instructions for the processing engine array 110) can be stored in an external memory (e.g., a memory outside of the neural network processing engine 102) in a compressed format. Compressing the data for the neural network can reduce the amount of memory space needed to store the neural network. Additionally, less time may be needed to read the data for the neural network into the neural network processing engine 102.

In various examples, the input selector circuit 130 can be used to determine the data that is input into the processing engine array 110 in any given clock cycle. In some examples, the input selector circuit 130 can control the data that is input into each row of the processing engine array 110. In some examples, the input selector circuit 130 can control the data that is input into a subset of the rows. In various examples, for a given row, the input selector circuit 130 can select between data that is output from the memory subsystem 104 and data that the input selector circuit 130 has selected for inputting into a different row. For example, for row[0], the input selector circuit 130 can determine to input data from the memory subsystem 104, and for row[3], the input selector circuit 130 can determine to input the data that the input selector circuit 130 determined to input into row[0]; that is, the same data from the memory subsystem 104. In this example, the same data from the memory subsystem 104 can be provided to more than one row of the processing engine array 110. The input selector circuit 130 can further be configured without any data duplication occurring, so that each row of the processing engine array 110 receives data from the memory subsystem 104.

In various examples, the ability of the input selector circuit 130 to duplicate the data being input into the processing engine array 110 can be used to improve the utilization of the processing engine array 110. For example, one way in which the neural network processing engine 102 can perform the computations for a layer of a neural network is for each input feature map to be input into a different row, with a filter being applied to the input feature map using the processing engines in the row. The input data 150, however, may have only one, three, or six input feature maps, or another number of input feature maps that is far less than the number of rows in the processing engine array 110. Thus, in the preceding example, when performing computations for the first layer of the neural network, only one, three, or six (or another number) of rows may be in use, with the remaining rows being idle. Subsequent layers may have more input feature maps, due the application of filters causing multiple output feature maps to be generated for each input feature map, such that a larger number of rows of the processing engine array 110 will be used for these layers. But the low utilization of the processing engine array 110 for the first layer can cause a cumulative reduction in the overall utilization of the processing engine array 110 over the course of many inferences.

One technique that can be used to increase utilization of the processing engine array 110 during computation of the first layer of a neural network is for the same input feature map to be input into multiple rows, with a different filter element being applied in each row. Having software load multiple copies of an input feature map into the memory subsystem 104 can be overly time consuming, however, due to limited bandwidth being available over the chip interconnect 120. The ability of the input selector circuit 130 to replicated data from the memory subsystem 104 thus provides a way to feed the same input feature map into more than one row of the processing engine array 110, without having to have more than one copy of the input feature map in the memory subsystem 104.

Figure 2:
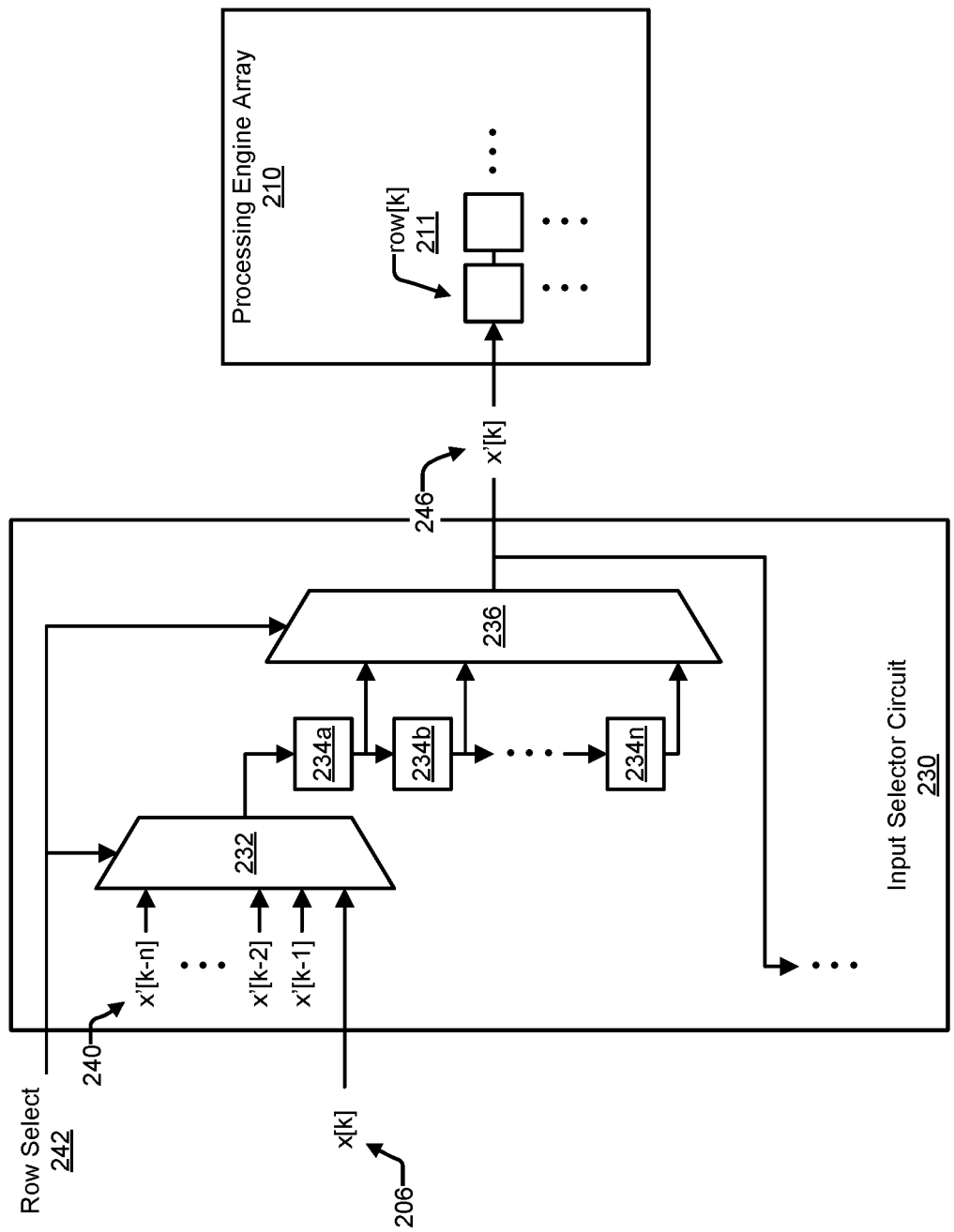
FIG. 2 includes a block diagram illustrating an example of an input selector circuit.

FIG. 2 includes a block diagram illustrating an example of an input selector circuit 230. In various examples, the input selector circuit 230 can include a first multiplexor 232 that can be configured to select the input data for a row of the processing engine array 210, and a second multiplexor 236 that can select a degree of delay for inputting the data into a row of the processing engine array 210. A row select 242 input into the input selector circuit 230 can determine the data, x'[k] 244, that is ultimately selected for the row. For the sake of clarity, the multiplexors for only one row, row[k] 211, where k denotes a row number, is shown. It is understood that a similar circuit as is illustrated in FIG. 2 can be used to select the input data for other rows of the processing engine array 210. In some cases, other rows of the processing engine array 210 can have a similar input selector circuit.

In various examples, a neural network processing engine can be configured such that one memory bank from the neural network processing engine's memory subsystem provides input data for one row of the processing engine array 210. This arrangement can enable the data from one input feature map to be loaded into one memory bank, from which the data for the input feature map can then be input into the same row.

In the example of FIG. 2, the data output by the memory bank for row[k] 211 is denoted as x[k] 206. For the memory bank output x[k] 206 to be input into row[k] 211, the row select 242 can configure the first multiplexor 232 to select x[k] 206 as the output of the first multiplexor 232.

In various examples, the first multiplexor 232 can also select from among other data 240 selected for inputting to the processing engine array 210. The connections for other data 240 are drawn from the outputs of other multiplexors, possibly in other selectors circuits; for clarity, these connections are not shown explicitly in FIG. 2. For example, the other data 240 can include the data selected for inputting into row[k−1] (e.g., the row preceding row[k] 211), which is denoted x'[k−1] in the example of FIG. 2. As another example, the other data 240 can include data selected for inputting into row[k−2] (e.g., two rows preceding row[k] 211). As another example, the other data 240 can include data selected for inputting into row[n], where n can be a row index that is less than or greater than k. In various examples, n can be as large as the number of rows in the processing engine array 210 and can be as small as 1 or −1. In some examples, n is equal to k−8, so that the data selected for input into a row that is eight rows above row[k] 211 can be selected for inputting into row[k] 211. In this example, n=8 can enable an input feature map to be input into two rows that are seven rows apart, which may occur when input data includes up to six input feature maps.

In some examples, it may be desirable to delay the data selected by the first multiplexor 232 by a number of clock cycles. Because the processing engine array 210 is a systolic array, the timing of entry of data into the processing engine array 210 can affect the result that the processing engine array 210 computes. Thus, in various implementations, the input selector circuit 230 can include one or more delay circuits 234a-234n, such as flip-flops, which can delay the output of the first multiplexor 232 by one to n clock cycles.

The delay circuits 234a-234n can be connected in a chain, such that, for example, a first delay circuit 234a can delay the data by one clock cycle, a second delay circuit 234b can delay the data by two clock cycles, and so on. the input selector circuit 230 can include a second multiplexor 236 that can be configured to select the desired delay. The output of the second multiplexor 236, denoted x'[k] 244 can be output by the input selector circuit 230 as the input to row[k] 211.

In various examples, x'[k] 244 can also be the input for other rows. This is illustrated in the example of FIG. 2 by a downward pointing arrow from the output of the second multiplexor 236. As an example, x'[k] 244 can be an input into a multiplexor that selects the input for row[k+1] and/or a multiplexor that selects the input for row[k+2]. In these and other examples, x'[k]244 can be input into more than one row of the processing engine array 210. In some examples, x'[k] 244 can be selected for input into a row up to eight rows below row[k] 211.

Figure 4:
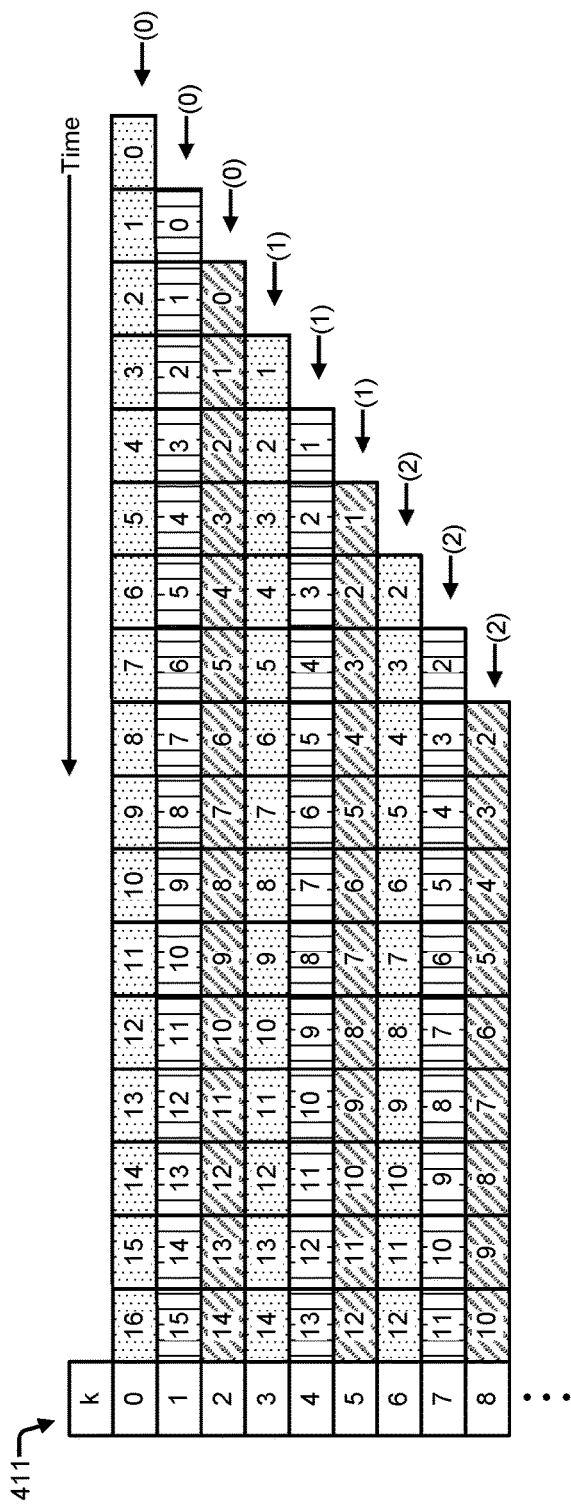
FIG. 4 includes a chart that illustrates an example of a selection of data for inputting into the rows of a processing engine array.
Figure 5:
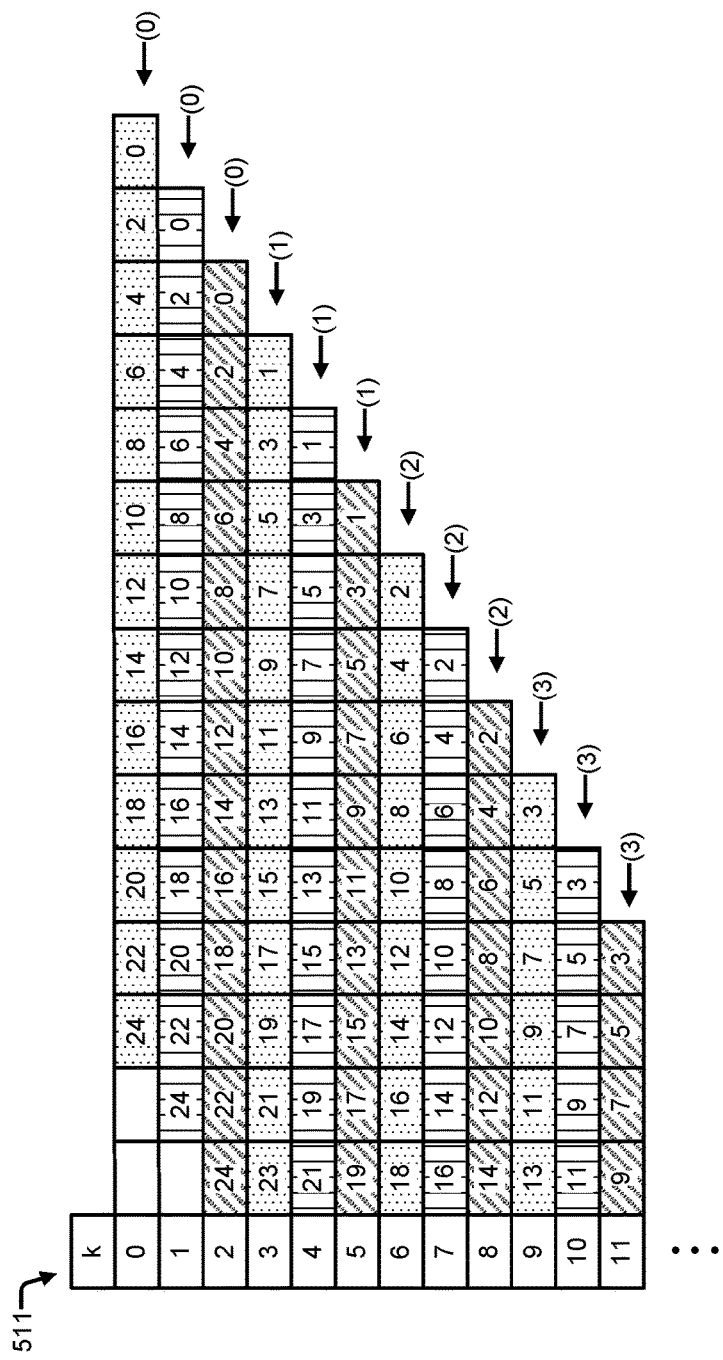
FIG. 5 includes a chart that illustrates another example of data selection for inputting into the rows of a processing engine array.

In various examples, the delay selected by the second multiplexor 236 depends on the data selected by the first multiplexor 232. For example, as illustrated in the examples of FIGS. 4, and 5, when, as in the example of FIG. 2, the row select 242 selects x'[k−1], the second multiplexor 236 can be configured to delay this data by one clock cycle. As a further example, when the row select 242 selects x'[k−2], the second multiplexor 236 can be configured to delay this data by two clock cycles. In these and other examples, the row select 242 can provide the configuration for both the first multiplexor 232 and the second multiplexor 236.

In various examples, the row select 242 value can be part of an instruction that makes up the data for a neural network. The row select 242 can, for example, be stored with the weights of the neural network, and be loaded into the memory subsystem of a neural network processing engine along with the weights. In various examples, the row select 242 can be determined by software that is operating the neural network processing engine. In these examples, the software may be responsible for loading the data for a neural network into the memory subsystem, including determining which data goes into which bank of the memory subsystem. In these examples, the software can determine whether and to which processing engine array 210 rows data is to be input.

Additionally, in various examples the row select 242 can vary for different layers of a neural network. For example, for the first layer of the neural network, the row select 242 can configure the first multiplexor 232 to select from among the other data 240, while for subsequent layers, the row select 242 can select the memory output, x[k] 206.

As noted previously, the arrangement of multiplexors, delay circuits, and signals can be similar for other rows of the processing engine array 210. In some examples, the input selector circuit 230 can have a different circuit for some rows that is illustrated in FIG. 2. For example, for row[0], the input selector circuit 230 may only be operable to select a memory output as the input for row[0]. In this example, the input selector circuit 230 may have only a delay circuit between the memory output and the input to the processing engine array 110. As another example, for row [1], the input selector circuit 230 may have only the memory output and the data selected for row[0] as possible choices for the input for row[1]. In this example, the circuit for row[1] can have multiplexors with fewer inputs, as well as fewer delay circuits. In some examples, some rows may have fewer choices as possible inputs than do other rows; for example some rows may be able to receive data provided to one of two previous rows, while other rows may be able to receive data provided to one of eight previous rows. In some examples, the input selector circuit 230 may be operable to select the input of other rows for a subset of all the rows of the processing engine array 210. For example, the input selector circuit 230 may be able to select the input data for the first half of the rows of the processing engine array 210 and not the second half, for every other row, for every third row, or for another subset of rows that is less than all the rows. Being able to select the input data for each row, however, can provide the greatest degree of flexibility over the data that is into the processing engine array 210.

Table 4 below illustrates an example of the utilization of the processing engine array 210 that can be achieved for several different neural networks when the data duplication capability of the input selector circuit 230 is used. A processing engine array 210 having 128 rows and 64 columns was used to produce the results illustrated in Table 4.

TABLE 4

| Neural Network | UINT8 utilization | FP16 utilization |
| --- | --- | --- |
| Resnet-34 | 80% (0) | 82% (0) |
|  | 85% (3) | 87.5% (3) |
| Resnet-50 | 75% (0) | 77% (0) |
|  | 80% (3) | 82% (3) |
| Resnet-152 | 88% (0) | 88% (0) |
|  | 90% (3) | 90.5% (3) |
| Inception_v3 | 58% (0) | 62% (0) |
|  | 65% (3) | 70% (3) |

In the example of Table 4, the numbers in the parenthesis indicates the amount of software replication that was used to produce the percentage of utilization. For example, (0) indicates that only hardware replication, using, for example, the input selector circuit 230 of FIG. 2, was used, and (3) indicates that software replication was used in addition to hardware replication. In this latter example, software placed three copies of the data into various memory banks, and the input selector circuit 230 was then use to replicate the data into multiple rows of the processing engine array 210.

Figure 3:
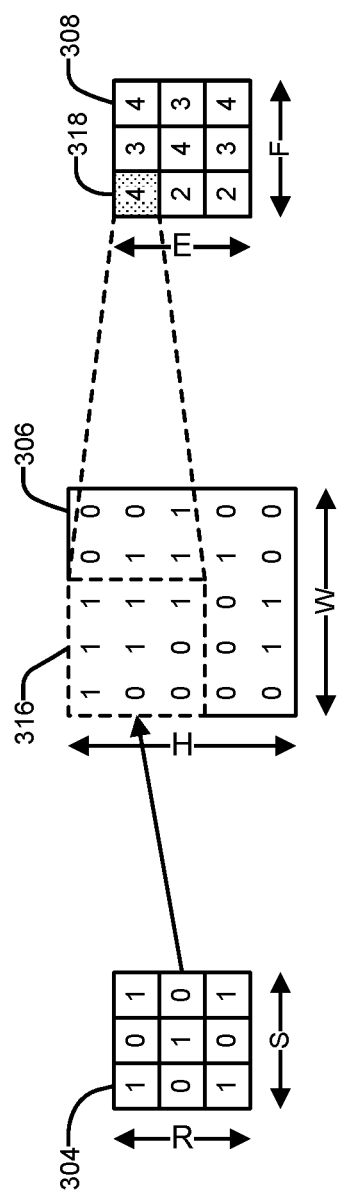
FIG. 3 illustrates graphically an example of a two-dimensional convolution, an operation that can occur in a layer of a convolutional neural network.

FIG. 3 illustrates graphically an example of a two-dimensional convolution, an operation that can occur in a layer of a convolutional neural network. This example is being provided to illustrate the manner in which data can be fed into a computational array of a neural network processor, including duplication of the data to more than one row of the array.

Convolutional neural networks are often used for tasks such as image recognition, speech recognition, machine translation, and other tasks. In the example of FIG. 3, an input feature map 306 includes some or all of the input data for an inference (e.g., the performance of the task). For example, the input feature map 306 can include the values of pixels from an image, with each index in the input feature map 306 storing an intensity of the color. As another example, the input feature map 306 can include letters and other symbols from a character string. In this example, the input feature map 306 is a two-dimensional representation of the input data. In other examples, the input data can be three-dimensional. For example, for a color input image, the input data can include three input feature maps, one each for the green, blue, and red channels of the input image. In the illustrated example, the input feature map 306 has a height H and a width W. With three-dimensional input data, a depth C can represent a count of the number of input feature maps. In some examples, the input data can be four-dimensional, such as when the input data includes virtual reality images. Virtual reality images can include, for example, six input feature maps, three for the red, green, and blue channels, multiplied by two for each eye.

A step in the operation of the neural network can involve application of a filter to the input feature map 306. In the example of FIG. 3, filter elements are arranged in a filter plane 304, a two-dimensional matrix of values having a height R and a width S. The values in the filter plane 304 can be selected to filter for particular features, such as lines, edges, curves, corners, blobs, ridges, and so on. The filter plane 304 can also be referred to as a kernel or a feature detector.

The convolution operation involves computing a value for each possible position of the filter plane 304 over the input feature map 306. This computation includes multiplying each element in the filter plane 304 by a corresponding value in the input feature map 306 and summing the result. For example, at a first position 316 of the input feature map 306, multiplying each value in the filter plane 304 by each corresponding value in the first position 316 results in a matrix {(1, 0, 1), (0, 1, 0), (0, 0, 1)}. In this example, the sum of the values in the matrix results in the value 4, which is placed in a corresponding first position 318 in an output feature map 308. A region of values from the input feature map 306 can be referred to as input activations. The result of the multiplication and summation can be referred to as an output activation. Additional indices in the output feature map 308 can be computed by sliding the filter plane 304 to a different position in the input feature map 306. For example, by sliding the filter plane 304 to the right by one position, and then right again by one position, the values 3 and 4, respectively, can be computed for the remainder of the top row of the output feature map 308. The second row of the output feature map 308 can be computed by returning the filter plane 304 to the first position 316, sliding the filter plane 304 down by one position, and again to the right.

The output feature map 308 represents a higher-level abstraction of the input feature map 306. The output feature map 308 can, for example, represent edges or textures found in the input feature map 306. In this example, the output feature map 308 has a height E and a width F, which is the same as the height R and width S of the filter plane 304. In other examples, E and F can be less than R and S, such as when the filter plane 304 is moved, between calculations, two positions instead of one. The number of positions the filter plane 304 is moved for each calculation is referred to as the stride.

In various examples, additional filters can be applied to the same input feature map 306 to produce additional output feature maps. For example, in one layer of the neural network, the neural network may be configured to conduct both edge detection, line detection, and texture detection, for which three different filters will be applied. In this example, the one layer can produce up to three output feature maps from the one input feature map 306.

With three-dimensional input data, in one layer of the neural network one filter may be applied to each of the input feature maps in the input data. Thus, for example, for three input feature maps, application of one filter can result in three output feature maps, and application of multiple filters can result in multiplication of the number of output feature maps produced.

In some example neural networks, the output feature maps produced by the computations for layer can become the input feature maps for the next layer. In some examples, the output feature maps may first be condensed, using, for example, pooling operations, to reduce the number of output feature maps, and the reduced number of output feature maps can be used as the input feature maps of the next layer.

FIG. 4 includes a chart 400 that illustrates an example of a selection of data for inputting into the rows of a processing engine array. For the sake of clarity, only the data for rows [0] through [8] are shown, and it is assumed the data for other rows can be selected in a similar manner, or in a different manner, and from similar sources or different sources. To illustrate the example of FIG. 4, the input feature map 306 of FIG. 3 will be used as an example of the input data for a layer of a neural network.

In the example chart 400 of FIG. 4, the first column indicates a row number 411, k, and the remaining columns indicate an index in an input feature map, as an indicator of the data that is to be supplied. In this example, the indices of the input feature maps are numbered from left to right and top to bottom, in raster scan order (e.g., the upper left corner is index 0, the upper right corner is index 4, lower left corner is index 20, and the lower right corner is index 24). Also in this example, time is indicated as progressing from right to left, such that the earliest data to enter the processing engine array is in the right-hand columns and the latest data to enter the processing engine array is in the left-hand columns. In some examples, each column can indicate the data input into the processing engine array in a different clock cycle. In the example of FIG. 4, numbers indicated in parenthesis indicate a filter index, also numbered in raster scan order, as an indicator of the filter element that is applied by the computations of a row.

The example chart 400 illustrates data being obtained for three input feature maps. The different input feature maps are indicated in FIG. 4 using different cross hatchings. Row[0] receives data for a first input feature map, and applies filter element (0) to this data. Row[1] receives data for the second input feature map, and also applies filter element (0) to this data. Row[2] receives data for the third input feature map, and also applies filter element (0) to this data. In this example, rows [0], [1], and [2] receive data first, and thus can receive data directly from the local buffer memory.

Further in this example, row[3] can also receive data for the first input feature map, and can apply filter element (1) to the data. In this row, instead of obtaining the data for the first input feature map from the buffer memory, an input selector circuit can be configured to route the data that is being provided to row[0] also to row[3]. As illustrated in the example of FIG. 3, filter element (1) is not applied to index 0 of the input feature maps, thus the input selector circuit need only activate the data duplication when the data for index 1 of the input feature map is read from the buffer memory. Additionally, for correct accumulation of the data into an output feature map, the data for row[3] is delayed by two clock cycles from when the data enters row[0].

Row[4] can similarly receive data for the second input feature map, starting at index 1, and delayed from when the data enters row[1]. The input selector circuit can similarly obtain the data for row[4] by routing the data being input into row[1] to row[4]. Row[5] can similarly receive data for the third input feature map, starting at index 1, and delayed from when the data enters row[2]. The input selector circuit can obtain the data for row[5] from the data being input into row[2].

Row[6] can also receive data from the first input feature map. In row[6], a third filter element (2) can be applied, starting at index 2 of the input feature map. For row[6], the input selector circuit can obtain the data from the data that is selected for row[0] or from the data that is selected for row[3]. When the input selector circuit is able to look back at least six rows from row[6], then the input selector circuit can use the data selected for row[0] or for row[3]. When the input selector circuit 230 is able to look back at most three rows, then the input selector circuit 230 can use the data selected for row[3]. Row[7] can similarly be supplied with data from the second input feature map, obtained from the data selected for row [1] or the data selected for row[4], and row[8] can be supplied with data from the third input feature map, obtained from data selected for row[2] or row[5].

The example illustrated in the chart 400 can be used, for example, when performing the computations for the first layer of a neural network. As discussed above, the inputs to the first layer may include three or more input feature maps, and applying filters to these input feature maps may occupy only three rows of the processing engine array. By duplicating the three input feature maps across multiple rows of the processing engine array, more of the processing engine array can be put to use when computing results for the first layer. Subsequent layers may have more input feature maps. For these layers, the input selector circuit can disable duplication of the data across multiple rows, and can select instead the output from the buffer memory. In some examples, for various layers of the neural network, the input selector circuit can select the output of the buffer memory for some rows and selected duplicated data for other rows.

FIG. 5 includes a chart 500 that illustrates another example of data selection for inputting into the rows of a processing engine array. In this example, for the sake of clarity, only data for rows [0] through [11] are shown, and it is understood that the processing engine array can have many more rows (e.g., 128 or 256 or another number of rows). To illustrate the example of FIG. 5, the input feature map 306 of FIG. 3 will be used as an example of the input data for a layer of a neural network.

In the example chart 500 of FIG. 5, the first column indicates a row number 511, k, and the remaining columns indicate an index in an input feature map, as an indicator of the data that is to be supplied. The elements of the input feature map are number from left to right and top to bottom. Time, in this example, is indicated as progressing from right to left, such that the first data to enter the processing engine array is on the right and the later data to enter the array is on the left. Numbers indicated in parenthesis indicate a filter index.

The example chart 500 illustrates data being obtained for three input feature maps. The different input feature maps are indicated in FIG. 5 using different cross hatchings. In this example, row[0] and row[3] both receive data for the first input feature map, with row[0] receiving the even-numbered indices and row[3] receiving the odd-numbered indices. A first filter element (0) is applied to the even-numbered indices, and second filter element (1) is applied to the odd-numbered indices. Application of the first filter element (0) to the even indices and the second filter element (1) to the odd indices reflects the operation illustrated in FIG. 3, where, in the first position 316, the first filter element is multiplied to the first index of the input feature map 306, and the second filter element is multiplied to the second index of the input feature map 306. In the example of FIG. 5, distributing operations for the first filter element (0) and the second filter element (1) can enable the processing engine array to perform the operations faster than when all of the data for one input feature map is input into one row.

To accomplish the division of an input feature map so that the even indices and the odd indices can be provided to different rows, in some examples, the software that is operating the neural network processor can write the data for the input feature map to two different banks in the local buffer memory. A input selector circuit can then select the output of the two banks as the input to row[0] and row[3]. Entry of the data for row[3] several clock cycles behind the data for row[0] may occur through the mechanism that reads data from the buffer memory.

The data for a second and third input feature map can similarly be split between two rows each. In the example of FIG. 5, the even indices of the second input feature map are input into row[1] and the odd indices are input into row[4]. The even indices of the third input feature map are input into row[2] and the odd indices are input into row[5]. The first filter element (0) is applied to in row[1] and row[2], and the second filter element is applied in row[4], and row[5]. As with row[0] and row[3], the data for rows one through 5 can also be obtained from the local buffer memory, with software loading the data into memory banks in the split arrangement. Data entering these rows can also be staggered in time by the instructions that read the buffer memory.

In this example, the three input feature maps can occupy six rows of the processing engine array. To have the three input feature maps occupy more rows, which can then be used to apply more filter elements, the input selector circuit can duplicate the data into other rows. For example, the even indices for the first input feature map can also be input into row[6], and the odd indices can be input into row[9]. In this example, a third filter element (2) can be applied in row[6] and a fourth filter element (3) can be applied in row[9]. To enable the data for the first input feature map to be input into row[6] and row[9], the input selector circuit can select for these rows the data being input into row[0] and row[3], respectively. For row[6], because the third filter element is first applied to index 2, the input selector circuit can activate the routing of data from the data provided to row[0] when index 2 is available. Additionally, the input selector circuit can stagger entry of the data behind the data that is being input into lower numbered rows, using delay circuits.

The data for the second and third input feature maps can similarly be duplicated to additional rows. In the chart 500, the even-numbered indices from the second feature maps are also input into row [7] and the odd-numbered indices are also input into row[10]. For the third input feature map, the even-numbered indices are also input into row[8] and the odd-numbered indices are also input into row[11]. Row[7] and row[8] further apply the third filter element (2) and row[10] and row[11] both apply the fourth filter element (3).

In various examples, duplication of the data to additional rows of the processing engine array can continue for any number of rows, though doing so may not be needed. For example, the filter plane 304 of FIG. 3 includes only nine elements, thus to apply all nine filter elements, the data for the three input feature maps need only be replicated three more times. As another example, particularly for input feature maps that are larger than the output feature map 308 illustrated in FIG. 3, software can divide the input feature map into smaller parts, and separately load the smaller parts into the buffer memory. For example, one half of the input feature map can be loaded into banks for two rows, while the other half can be loaded into banks for a different two rows. In other examples, the input feature map can further be divided into smaller parts, with each of the smaller parts being loaded into different memory banks.

Figure 6:
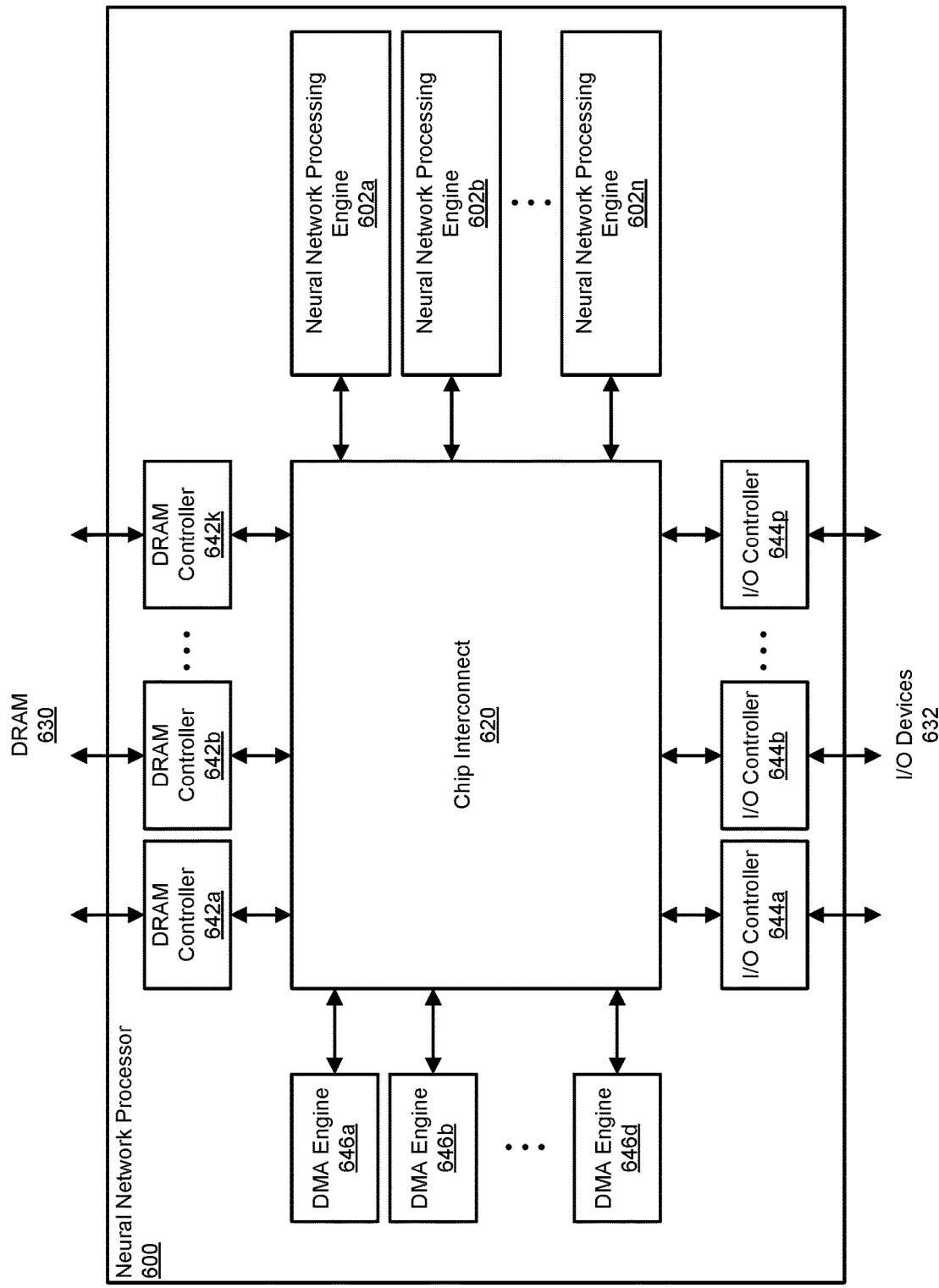
FIG. 6 includes a block diagram that illustrates an example of a neural network processor.

In various implementations, the neural network processing engine discussed above can be part of a neural network processor. FIG. 6 includes a block diagram that illustrates an example of a neural network processor 600 that has multiple neural network processing engines 602a-602n. Each of the neural network processing engines 602a-602n can include a memory subsystem and processing engine array, and can execute the computation required for a neural network to perform a task for which the neural network was programmed. In the illustrated example, the neural network processor 600 includes n neural network processing engines 602a-602n.

The example neural network processor 600 further includes DRAM controllers 642a-642k for communicating with processor memory, implemented in this example using DRAM 630. In the illustrated example, the neural network processor 600 includes k DRAM controllers 642a-642k, each of which may be able to communicate with an independent set of banks of DRAM. In other examples, other types of RAM technology can be used for the processor memory. The DRAM controllers 642a-642k can also be referred to as memory controllers.

In various examples, data for one or more neural networks can be stored in the DRAM 630. The neural networks can include different neural networks optimized for different tasks. For example, one neural network can be optimized for speech recognition, another for machine translation, and another for image recognition. In these and other examples, the neural network processor 600 can move or copy the data for the appropriate neural network from the DRAM 630 to a neural network processor, and can then instruct the neural network processor to execute the neural network. In some examples, the neural network processor 600 can be configured to preload neural networks on the neural network processors. That is, some or all of the weights for different neural networks can be loaded onto different neural network processing engines 602a-602n before any input data is received, so that the neural network processing engines 602a-602n are ready to execute a respective neural network as soon as the neural network processor 600 receives input data.

The example neural network processor 600 includes I/O controllers 644a-644p for communicating with I/O devices 632 in the system. The neural network processor 600 can communicate with I/O devices over, for example, a processor bus. In some examples, the processor bus can be implemented using Peripheral Component Interconnect (PCI) and/or a variation of the PCI bus protocol. The processor bus can connect the neural network processor 600 to I/O devices 632 such as, for example, input and output devices, memory controllers, storage devices, and/or network interface cards, among other things. In some examples, the I/O controllers 644-644p can enable the neural network processor 600 to act as an I/O device for a host processor. In the illustrated example, the neural network processor 600 includes p I/O controllers 644a-644p, each of which may include a separate root complex and may communicate with a separate set of I/O devices 632. In other examples, other standardized bus protocols, such as Ultra Path Interconnect (UPI) can be used for the host bus. In other examples, a proprietary bus protocol can be used.

The example neural network processor 600 further includes DMA engines 646a-646d that can move data between the neural network processing engines 602a-602n, DRAM controllers 642a-642k, and I/O controllers 644a-644p. In the illustrated example, the neural network processor 600 includes d DMA engines 646a-646d. In some implementations, the DMA engines 646a-646d can be assigned to specific tasks, such as moving data from the DRAM controllers 642a-to the neural network processing engines 602a-602n, or moving data between the I/O controllers 644a-644p and the neural network processing engines 602a-602n. In some implementations, at least one DMA engine 646a-646d can be dedicated to each neural network processing engine 602a-602n. In some implementations, the DMA engines 646a-646d can be treated as a pool instead of being dedicated to a function or component, such that whenever data needs to be moved, an available DMA engine 646a-646d is engaged.

In the example neural network processor 600, the various components can communicate over a chip interconnect 620. The chip interconnect 620 primarily includes wiring for routing data between the components of the neural network processor 600. In some cases, the chip interconnect 620 can include a minimal amount of logic, such as multiplexors to control the direction of data, flip-flops for handling clock domain crossings, and timing logic.

In some examples, each of the neural network processing engines 602a-602n can simultaneously be executing a different neural network. In some examples, two or more of the neural network processing engines 602a-602n can be execute the same neural network for different inputs. In some examples, two or more of the neural network processing engines 602a-602n can be executing parts of the same neural network (e.g., parts of the same layer or different layers). In some examples, two or more of the neural network processing engines 602a-602n can sequentially execute layers of a neural network, such that inputs can be pipelined through the neural network processing engines.

Figure 7:
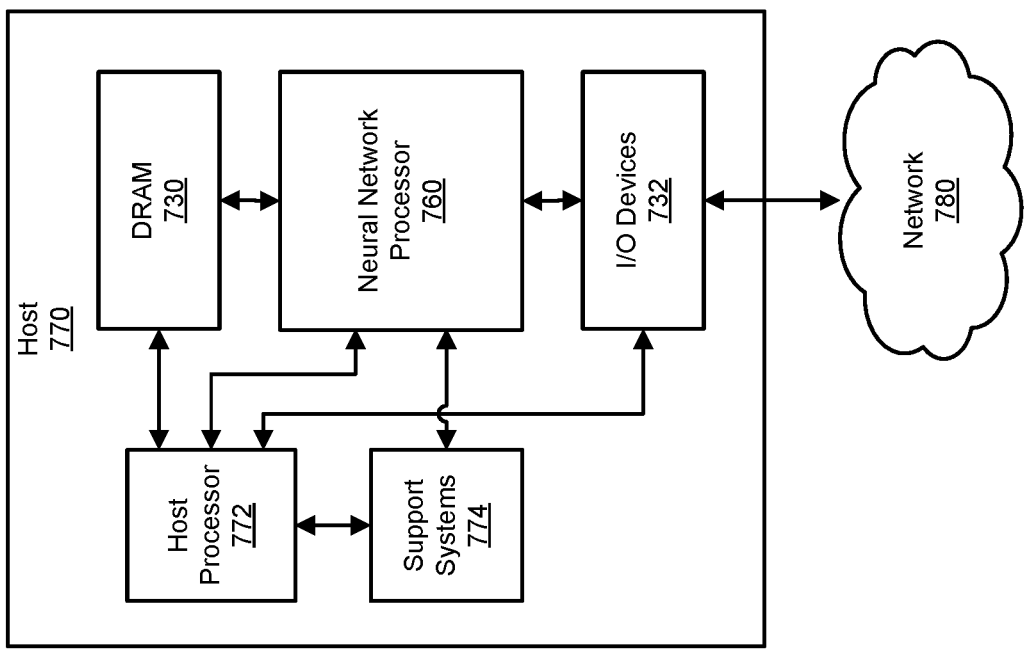
FIG. 7 includes a block diagram that illustrates an example of a host system in which a neural network processor can be used.

FIG. 7 includes a block diagram that illustrates an example of a host system 770 in which a neural network processor 760 can be used. The example host system 770 includes the neural network processor 760, a host processor 772, DRAM 730 or processor memory, I/O devices 732, and support systems 774. In various implementations, the host system 770 can include other hardware that is not illustrated here.

The host processor 772 is a general purpose integrated circuit that is capable of executing program instructions. In some examples, the host processor 772 can include multiple processing cores. A multi-core processor may include multiple processing units within the same processor In some examples, the host system 770 can include more than one host processor 772. In some examples, the host processor 772 and the neural network processor 760 can be one chip, such as, one or more integrated circuits within the same package.

In various examples, the host processor 772 can communicate with other components in the host system 770 over one or more communication channels. For the example, the host system 770 can include a host processor bus, which the host processor 770 can use to communicate with the DRAM 730, for example. As another example, the host system 770 can include an I/O bus, such as a PCI-based bus, over which the host processor 770 can communicate with the neural network process 760 and/or the I/O devices 732, for example. In various examples, the host system 770 can, alternatively or additionally, include other communication channels or busses, such as serial busses, power management busses, storage device busses, and so on.

In some examples, software programs executing on the host processor 772 can receive or generate input for processing by the neural network processor 760. In some examples, the programs can select an appropriate neural network to execute for a given input. For example, a program may be for language translation, and can select one or more neural networks capable of speech recognition and/or machine translation. In these and other examples, the programs can configure the neural network processor 760 with the neural network to execute, and/or can select a neural network processing engine on the neural network processor 760 that has previously been configured to execute the desired neural network. In some examples, once the neural network processor 760 has started inference on input data, the host processor 772 can manage the movement of data (such as weights, instructions, intermediate results, results of conditional layers, and/or final results) into or out of the neural network processor 760.

In some examples, a software program that is using the neural network processor 760 to conduct inference can read the result from a conditional layer from the neural network processor 760 and/or from a storage location, such as in DRAM 730. In these examples, the program can determine what action the neural network should take next. For example, the program can determine to terminate the inference. As another example, the program can determine to change the direction of the inference, which can be translated by lower level code and/or the neural network processor to a next layer to execute. In these and other examples, the execution flow of the neural network can be coordinate by software.

The DRAM 730 is memory that is used by the host processor 772 for storage of program code that the host processor 772 is in the process of executing, as well as values that are being operated on. In some examples, the data for a neural network (e.g., weight values, instructions, and other data) can be all or partially stored in the DRAM 730. DRAM is a common term for processor memory, and though DRAM is volatile memory, processor memory can be volatile and/or non-volatile. Though not illustrated here, the host system 770 can include other volatile and non-volatile memories for other purposes. For example, the host system 770 can include a Read-Only Memory (ROM) that stores boot code for booting the host system 770 at power on, and/or Basic Input/Output System (BIOS) code.

Though not illustrated here, the DRAM 730 can store instructions for various programs, which can be loaded into and be executed by the host processor 772. For example, the DRAM 730 can be storing instructions for an operating system, one or more data stores, one or more application programs, one or more drivers, and/or services for implementing the features disclosed herein.

The operating system can manage and orchestrate the overall operation of the host system 770, such as scheduling tasks, executing applications, and/or controller peripheral devices, among other operations. In some examples, a host system 770 may host one or more virtual machines. In these examples, each virtual machine may be configured to execute its own operating system. Examples of operating systems include Unix, Linux, Windows, Mac OS, iOS, Android, and the like. The operating system may, alternatively or additionally, be a proprietary operating system.

The data stores can include permanent or transitory data used and/or operated on by the operating system, application programs, or drivers. Examples of such data include web pages, video data, audio data, images, user data, and so on. The information in the data stores may, in some examples, be provided over the network(s) to user devices. In some cases, the data stores may additionally or alternatively include stored application programs and/or drivers. Alternatively or additionally, the data stores may store standard and/or proprietary software libraries, and/or standard and/or proprietary application user interface (API) libraries. Information stored in the data stores may be machine-readable object code, source code, interpreted code, or intermediate code.

The drivers can include programs that provide communication between components in the host system 770. For example, some drivers can provide communication between the operating system and peripheral devices or I/O devices 732. Alternatively or additionally, some drivers may provide communication between application programs and the operating system, and/or application programs and peripheral devices accessible to the host system 770. In many cases, the drivers can include drivers that provide well-understood functionality (e.g., printer drivers, display drivers, hard disk drivers, Solid State Device drivers, etc.). In other cases, the drivers may provide proprietary or specialized functionality.

The I/O devices 732 can include hardware for connecting to user input and output devices, such as keyboards, mice, pens, tablets, voice input devices, touch input devices, displays or monitors, speakers, and printers, among other devices The I/O devices 732 can also include storage drives and/or network interfaces for connecting to a network 780. For example, the host system 770 can use a network interface to communicate with storage devices, user terminals, other computing devices or servers, and/or other networks, among various examples.

In various examples, one or more of the I/O devices 732 can be storage devices. In these examples, the storage device include non-volatile memory and can store program instructions and/or data. Examples of storage devices include magnetic storage, optical disks, solid state disks, flash memory, and/or tape storage, among others. The storage device can be housed in the same chassis as the host system 770 or may be in an external enclosure. A storage device can be fixed (e.g., attached by screws) or removable (e.g., having a physical release mechanism and possibly a hot-plug mechanism).

Storage devices, the DRAM 730, and any other memory component in the host system 770 are examples of computer-readable storage media. Computer-readable storage media are physical mediums that are capable of storing data in a format that can be read by a device such as the host processor 772. Computer-readable storage media can be non-transitory. Non-transitory computer-readable media can retain the data stored thereon when no power is applied to the media. Examples of non-transitory computer-readable media include ROM devices, magnetic disks, magnetic tape, optical disks, flash devices, and solid state drives, among others. as used herein, computer-readable storage media does not include computer-readable communication media.

In various examples, the data stored on computer-readable storage media can include program instructions, data structures, program modules, libraries, other software program components, and/or other data that can be transmitted within a data signal, such as a carrier wave or other transmission. The computer-readable storage media can, additionally or alternatively, include documents, images, video, audio, and other data that can be operated on or manipulated through the use of a software program.

In various examples, one or more of the I/O devices 732 can be PCI-based devices. In these examples, a PCI-based I/O device includes a PCI interface for communicating with the host system 770. The term "PCI" or "PCI-based" may be used to describe any protocol in the PCI family of bus protocols, including the original PCI standard, PCI-X, Accelerated Graphics Port (AGP), and PCI-Express (PCIe) or any other improvement or derived protocols that are based on the PCI protocols discussed herein. The PCI-based protocols are standard bus protocols for connecting devices, such as a local peripheral device, to a host device. A standard bus protocol is a data transfer protocol for which a specification has been defined and adopted by various manufacturers. Manufacturers ensure that compliant devices are compatible with computing systems implementing the bus protocol, and vice versa. As used herein, PCI-based devices also include devices that communicate using Non-Volatile Memory Express (NVMe). NVMe is a device interface specification for accessing non-volatile storage media attached to a computing system using PCIe.

A PCI-based device can include one or more functions. A "function" describes the hardware and/or software of an operation that may be provided by the PCI-based device. Examples of functions include mass storage controllers, network controllers, display controllers, memory controllers, serial bus controllers, wireless controllers, and encryption and decryption controllers, among others. In some cases, a PCI-based device may include more than one function. For example, a PCI-based device may provide a mass storage controller and a network adapter. As another example, a PCI-based device may provide two storage controllers, to control two different storage resources. In some implementations, a PCI-based device may have up to eight functions.

In some examples, the PCI-based device can include single-root I/O virtualization (SR-IOV). SR-IOV is an extended capability that may be included in a PCI-based device. SR-IOV allows a physical resource (e.g., a single network interface controller) to appear as multiple virtual resources (e.g., sixty-four network interface controllers). Thus, a PCI-based device providing a certain functionality (e.g., a network interface controller) may appear to a device making use of the PCI-based device to be multiple devices providing the same functionality. The functions of an SR-IOV-capable storage adapter device may be classified as physical functions (PFs) or virtual functions (VFs). Physical functions are fully featured functions of the device that can be discovered, managed, and manipulated. Physical functions have configuration resources that can be used to configure or control the storage adapter device. Physical functions include the same configuration address space and memory address space that a non-virtualized device would have. A physical function may have a number of virtual functions associated with it. Virtual functions are similar to physical functions, but are light-weight functions that may generally lack configuration resources, and are generally controlled by the configuration of their underlying physical functions. Each of the physical functions and/or virtual functions may be assigned to a respective thread of execution (such as for example, a virtual machine) running on a host device.

In various implementations, the support systems 774 can include hardware for coordinating the operations of the neural network processor 760. For example, the support systems 774 can include a microprocessor that coordinates the activities of the neural network processor 760, including moving data around on the neural network processor 760. In this example, the microprocessor can be an integrated circuit that can execute microcode. Microcode is program code that can enable an integrated circuit to have some flexibility in the operations that the integrated circuit can execute, but because the program code uses a limited instruction set, the microprocessor may have much more limited capabilities than the host processor 772. In some examples, the program executed by the microprocessor is stored on the hardware of microprocessor, or on a non-volatile memory chip in the host system 770. In some examples, the microprocessor and the neural network processor 760 can be on chip, such as one integrated circuit on the same die and in the same package.

In some examples, the support systems 774 can be responsible for taking instructions from the host processor 772 when programs executing on the host processor 772 request the execution of a neural network. For example, the host processor 772 can provide the support systems 774 with a set of input data and a task that is to be performed on the set of input data. In this example, the support systems 774 can identify a neural network that can perform the task, and can program the neural network processor 760 to execute the neural network on the set of input data. In some examples, the support systems 774 only needs to select an appropriate neural network processing engine of the neural network processor. In some examples, the support systems 774 may need to load the data for the neural network onto the neural network processor 760 before the neural network processor 760 can start executing the neural network. In these and other examples, the support systems 774 can further receive the output of executing the neural network, and provide the output back to the host processor 772.

In some examples, the operations of the support systems 774 can be handled by the host processor 772. In these examples, the support systems 774 may not be needed and can be omitted from the host system 770.

In various examples, the host system 700 can include a combination of host systems, processor nodes, storage subsystems, and I/O chassis that represent user devices, service provider computers or third party computers.

User devices can include computing devices to access an application (e.g., a web browser or mobile device application). In some examples, the application may be hosted, managed, and/or provided by a computing resources service or service provider. The application may enable a user to interact with the service provider computer to, for example, access web content (e.g., web pages, music, video, etc.). The user device may be a computing device such as, for example a mobile phone, a smart phone, a personal digital assistant (PDA), a laptop computer, a netbook computer, a desktop computer, a thin-client device, a tablet computer, an electronic book (e-book) reader, a gaming console, etc. In some examples, the user device may be in communication with the service provider computer over one or more networks. Additionally, the user device may be part of the distributed system managed by, controlled by, or otherwise part of the service provider computer (e.g., a console device integrated with the service provider computers).

The host system 700 can also represent one or more service provider computers. A service provider computer may provide a native application that is configured to run on user devices, which users may interact with. The service provider computer may, in some examples, provide computing resources such as, but not limited to, client entities, low latency data storage, durable data storage, data access, management, virtualization, cloud-based software solutions, electronic content performance management, and so on. The service provider computer may also be operable to provide web hosting, databasing, computer application development and/or implementation platforms, combinations of the foregoing or the like. In some examples, the service provider computer may be provided as one or more virtual machines implemented in a hosted computing environment. The hosted computing environment can include one or more rapidly provisioned and released computing resources. These computing resources can include computing, networking and/or storage devices. A hosted computing environment may also be referred to as a cloud computing environment. The service provider computer may include one or more servers, perhaps arranged in a cluster, as a server farm, or as individual servers not associated with one another, and may host application and/or cloud-based software services. These servers may be configured as part of an integrated, distributed computing environment. In some examples, the service provider computer may, additionally or alternatively, include computing devices such as for example a mobile phone, a smart phone, a personal digital assistant (PDA), a laptop computer, a desktop computer, a netbook computer, a server computer, a thin-client device, a tablet computer, a gaming console, etc. In some instances, the service provider computer may communicate with one or more third party computers.

Figure 8:
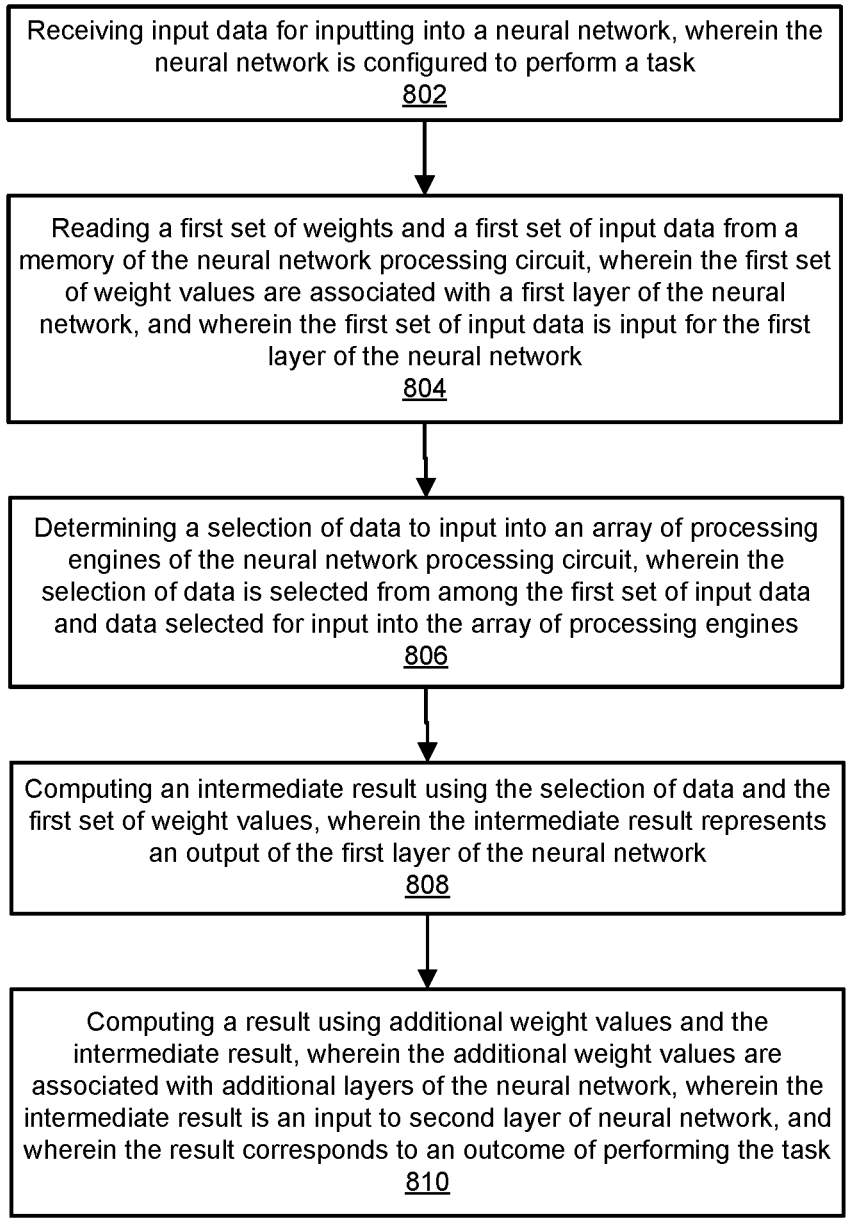
FIG. 8 illustrates an example of a process for executing a neural network.

FIG. 8 illustrates an example of a process 800 for executing a neural network. The example process 800 can be implemented by the systems described above, such as for example by an integrated circuit implementing a neural network processor or a neural network processing engine. For example, the process 800 can be implemented by an integrated circuit that includes an array of processing engines, where each processing engine includes a multiplier-accumulator circuit. The integrated circuit can further include a memory operable to store weight values and instructions for a neural network, where the weight values were previously determined using training data, wherein the instructions configure a computation executed by the array of processing engines. The integrated circuit can further include a selector circuit operable to select data to input into the array of processing engines. The data can selected from output from the memory and other data selected by the selector circuit for input into the array of processing engines.

At step 802, the process 800 includes receiving input data for inputting into a neural network, wherein the neural network is configured to perform a task. The input data can be, for example, an image and the task can be image recognition. As another example, the input data can be an audio signal and the task can be speech recognition. As another example, the input data can be a character string and the task can be machine translation.

At step 804, the process 800 includes reading a first set of weights and a first set of input data from the memory of the neural network processing circuit, wherein the first set of weight values are associated with a first layer of the neural network, and wherein the first set of input data is input for the first layer of the neural network. In various examples, the first set of weights can be associated with a filter that is to be applied to the first set of input data. For example, the first set of weight scan include the filter elements in a filter plane.

In some examples, the first set of input data includes a set of input feature maps, wherein a number of the set of input feature maps is less than a number of rows in the array of processing engines. In some examples, the process 800 includes inputting each input feature map from the set of input feature maps into a different row in the array of processing engines. In these examples, a filter can be applied to each input map using the computations performed by the row of processing engines. In some examples, columns of the array of processing engines compute a set of output feature maps. For example, the columns can accumulate multiplications performed at each processing engine. In these and other examples, the set of output feature maps an used as input feature maps for a subsequent layer of the neural network.

In some examples, the process 800 includes inputting an input feature map from the set of input feature maps into a first row and a second row in the array of processing engines. In these examples, a first filter element can be applied using the first row and a second filter element can applied using the second row. In some examples, input of the input feature map into the second row can be delayed relative to input of the input feature map into the first row, such that the data is input into the second row later (e.g., one or more clock cycles) then when the data is input into the first row.

At step 806, the process 800 includes determining a selection of data to input into the array of processing engines of the neural network processing circuit, wherein the selection of data is selected from among the first set of input data and data selected for input into the array of processing engines. For example, for a first row of the array of processing engines, the selector circuit can determine to data output by the memory (e.g., the first set of input data). This data can further be selected for input into a second row of the array of processing engines. In this way, the same data can be provided to different rows of the array of processing engines.

In some examples, the selector circuit is operable to select data for inputting into a plurality of rows of the array of processing engines. For example, the selector circuit may be able to select the data to input into each row of the array of processing engines, or into a subset of all the rows. For example, the selector circuit can be operable to select a first set of data for inputting into a first set of rows of the array of processing engines, and to select a second set of data for inputting into a second set of rows of the array of processing engines. In this example, the second set of data is selected from data that excludes the first set of data. That is, the second set of data can be selected from among data output by the memory and the second set of data, and not any of the first set of data. The first set of data can similarly be selected from among data output from the memory and the first set of data, and not any of the second set of data. In this example, duplication of data among the first set of rows is possible and duplication of data is possible among the second set of rows, but there is no duplication of data between the first set of rows and the second set of rows. In this example, complexity in the selector circuit, such as fan-in counts, fan-out counts, and/or trace lengths, can be reduced, so that the selector circuit is better able to meet timing and layout requirements, for example.

In some examples, the memory of the neural network processor includes a plurality of banks. In these examples, a set of banks can be configured to provide input data for a corresponding set of rows of the array of processing engines. For example, a bank can be designated as providing the input for each row of the array of processing engines. In these examples, the selector circuit can be operable to select output from a bank from the set of banks for inputting into a corresponding row from the set of rows. In some examples, the selector circuit can, alternatively or additionally, be operable to select output from a bank from the set of banks for inputting into a first row from the set of rows and another row of the array of processing engines, so that the data from one bank is input into more than one row. In some examples, the selector circuit includes a multiplexor for selecting from among the output from the memory and other inputs selected by the selector circuit.

At step 808, the process 800 includes computing an intermediate result using the selection of data and the first set of weight values, wherein the intermediate result represents an output of the first layer of the neural network. In some examples, when computing an intermediate result for a first layer of the neural network, the selector circuit can be configured to select a combination of input data read from the memory and other data selected by the selector circuit for inputting into the array of processing engines. For example, the selector circuit can select data read from the memory for a first row, and select the data selected for the first row for a second row.

In some examples, the selector circuit can include a delay circuit and a multiplexor for selecting a delay, where the delay delays input of data into the array of processing engines. In some examples, the delay corresponds to data selected for input into the array of processing engines.

At step 810, the process 800 includes computing a result using additional weight values and the intermediate result, wherein the additional weight values are associated with additional layers of the neural network, wherein the intermediate result is an input to second layer of neural network, and wherein the result corresponds to an outcome of performing the task. In various examples, the neural network can include a plurality of layers. In these examples, performing the task can include successively computing intermediate results for each layer of the plurality of layers, and wherein the result is an output of a last layer from the plurality of layers. In some examples, for some layers, the process 800 can include configuring the selector circuit to disable the selector circuit from selecting other data selected by the selector circuit for inputting into the array of processing engines. For example, when, for a layer of the neural network, data from the memory is to be used as input to the layer, the selector circuit can be configured to select the output from the memory as input for the array of processing engines, and not select other data that the selector circuit has selected for inputting into the array of processing engines. In this example, the array of processing engines will not receive duplicates of any data.

In some examples, the process 800 can, alternatively or additionally, include, upon receiving input data, using weight values and instructions for a neural network to perform a task using the neural network. In these examples, process 800 can include reading a first set of weight values from the memory, wherein the first set of weight values is associated with a first layer of the neural network. The process 800 can further include reading a first set of input data from the memory, wherein the first set of input data is input for the first layer of the neural network.

In some examples, the process 800 can further include configuring, using an instruction, the selector circuit to output a selection of data for inputting into the array of processing engines, wherein the selection of data is selected from among the first set of input data and other data selected for input into the array of processing engines. In some examples, the selection of data includes a duplicate of the other data selected for input into the array of processing engines. In some examples, the other data selected for input into the array of processing engines and the duplicate of the other data are input for different rows of the array of processing engines. In some examples, the duplicate of the other data includes less than all of the other data. For example, the duplicated data can exclude the first element of the other data, the first two elements of the other data, the first four elements, or some other number of elements.

In some examples, the process 800 can further include computing an intermediate result using the selection of data and the first set of weights values, wherein the intermediate result is computed using the array of processing engines, and wherein the intermediate result represents an output of the first layer of the neural network. The process 800 can further include reading additional weight values for additional layers of the neural network. The process 800 can further include reading the intermediate result and additional intermediate results. The process 800 can further include computing a result using the additional weight values, the intermediate result, and the additional intermediate results, wherein the result is computed using the array of processing engines, and wherein the result corresponds to an outcome of performing the task. In some examples, the process 800 can further include configuring the selector circuit to output data from the memory when computing results for the additional layers of the neural network.

The modules described herein may be software modules, hardware modules or a suitable combination thereof. If the modules are software modules, the modules can be embodied on a non-transitory computer readable medium and processed by a processor in any of the computer systems described herein. It should be noted that the described processes and architectures can be performed either in real-time or in an asynchronous mode prior to any user interaction. The functions described herein can be provided by one or more modules that exist as separate modules and/or module functions described herein can be spread over multiple modules.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated examples thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed examples (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate example of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain examples require at least one of X, at least one of Y, or at least one of Z to each be present.

Various examples of this disclosure are described herein, including the best mode known to the inventors for carrying out the disclosure. Variations of those examples may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. An integrated circuit, comprising:
    an array of processing engines comprising a first row, a second row, a third row, and a fourth row;
    a memory operable to store weight values for a neural network and input data, wherein the weight values include a first weight value and a second weight value, and wherein the input data includes a set of input features maps including a first input feature map and a second input feature map;
    a selector circuit operable to:
        select the input data from the memory to input into the array of processing engines, wherein selecting the input data includes selecting the first input feature map for inputting into the first row at a first time, selecting the second input feature map for inputting into the second row at a second time after the first time, selecting the first input feature map for inputting into the third row at a third time after the second time, and selecting the second input feature map for inputting into the fourth row at a fourth time after the third time, such that the selector circuit is operable to alternate between selecting the first input feature map and the second feature map for inputting into different rows of the array of processing engines; and
    wherein the integrated circuit is operable to:
        read the weight values from the memory; and
        provide the weight values to the array of processing engines, wherein
    providing the weight values includes Providing the first weight value to the first row and the second row and providing the second weight value to the third row and the fourth row.

2. The integrated circuit of claim 1, wherein, upon receiving the input data, the integrated circuit is operable to use the weight values to perform a task defined for the neural network, and wherein performing the task includes:
    computing a result using the array of processing engines and using the selected input data and the weight values, wherein the result correspond to an outcome of performing the task.

3. The integrated circuit of claim 2, wherein performing the task further includes:
    configuring, when computing an intermediate result for a first layer of the neural network, the selector circuit to select a combination of the input data read from the memory and other data selected by the selector circuit for inputting into the array of processing engines.

4. The integrated circuit of claim 2, wherein performing the task further includes:
    configuring the selector circuit to disable the selector circuit from selecting other data selected by the selector circuit for inputting into the array of processing engines.

5. The integrated circuit of claim 1, wherein the selector circuit is operable to:
    select a first set of data for inputting into a first set of rows of the array of processing engines, the first set of rows including the first row and the third row; and
    select a second set of data for inputting into a second set of rows of the array of processing engines, the second set of rows including the second row and the fourth row, wherein the second set of data is selected from data that excludes the first set of data.

6. The integrated circuit of claim 1, wherein the memory includes a set of banks, and wherein the set of banks are configured to provide the input data for a corresponding set of rows of the array of processing engines.

7. The integrated circuit of claim 6, wherein the selector circuit is operable to select an output from a bank from the set of banks for inputting into a corresponding row from the set of rows.

8. The integrated circuit of claim 1, wherein the selector circuit includes a multiplexor, the multiplexor having an input coupled to the output from the memory and having other inputs coupled to outputs of other multiplexors.

9. The integrated circuit of claim 1, wherein the selector circuit includes a delay circuit and a multiplexor for selecting a delay, wherein the delay delays input of the input data into the array of processing engines.

10. The integrated circuit of claim 1, wherein the second row is immediately after the first row.

11. The integrated circuit of claim 1, wherein the first row and the second row are separated by one or more rows.

12. A computer-implemented method, comprising:
    receiving, at a neural network processing circuit, input data for inputting into a neural network, wherein the neural network is configured to perform a task;
    reading a first set of weight values and the input data from a memory of the neural network processing circuit, wherein the first set of weight values are associated with a first layer of the neural network and include a first weight value and a second weight value, wherein the input data includes a set of input feature maps including a first input feature map and a second input feature map;
    providing the first set of weight values to an array of processing engines, the array of processing engines comprising a first row, a second row, a third row, and a fourth row, wherein providing the first set of weight values includes providing the first weight value to the first row and the second row and providing the second weight value to the third row and the fourth row;
    determining a selection of the input data to input into the array of processing engines of the neural network processing circuit, wherein determining the selection of the input data includes selecting the first input feature map for inputting into the first row at a first time, selecting the second input feature map for inputting into the second row at a second time after the first time, selecting the first input feature map for inputting into the third row at a third time after the second time, and selecting the second input feature map for inputting into the fourth row at a fourth time after the third time;

computing an intermediate result using the selection of the input data and the selection of the first set of weight values, wherein the intermediate result represents an output of the first layer of the neural network; and computing a result using additional weight values and the intermediate result, wherein the additional weight values are associated with additional layers of the neural network, wherein the intermediate result is an input to second layer of neural network, and wherein the result corresponds to an outcome of performing the task.

13. The computer-implemented method of claim 12, wherein the neural network includes a plurality of layers, wherein performing the task includes successively computing intermediate results for each layer of the plurality of layers, and wherein the result is an output of a last layer from the plurality of layers.

14. The computer-implemented method of claim 12, wherein a number of the set of input feature maps is less than a number of rows in the array of processing engines.

15. The computer-implemented method of claim 12, wherein columns of the array of processing engines compute a set of output feature maps, and wherein the set of output feature maps are used as input feature maps for a subsequent layer of the neural network.

16. The computer-implemented method of claim 12, wherein the second row is immediately after the first row.

17. The computer-implemented method of claim 12, wherein the first row and the second row are separated by one or more rows.

\* \* \* \* \*